United States Patent
Wen et al.

(10) Patent No.: US 11,605,870 B2
(45) Date of Patent: Mar. 14, 2023

(54) SURFACE WAVE EXCITATION DEVICE HAVING A MULTI-LAYER PCB CONSTRUCTION WITH CLOSED REGIONS THEREIN

(71) Applicant: HUAWEI TECHNOLOGIES CO., LTD., Guangdong (CN)

(72) Inventors: Yue Wen, Shenzhen (CN); Chao Wang, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 42 days.

(21) Appl. No.: 17/202,916

(22) Filed: Mar. 16, 2021

(65) Prior Publication Data

US 2021/0204392 A1 Jul. 1, 2021

Related U.S. Application Data

(63) Continuation of application No. PCT/CN2018/105950, filed on Sep. 17, 2018.

(51) Int. Cl.
*H01P 3/10* (2006.01)
*H05K 1/02* (2006.01)

(52) U.S. Cl.
CPC ............ *H01P 3/10* (2013.01); *H05K 1/025* (2013.01); *H05K 1/0298* (2013.01)

(58) Field of Classification Search
CPC ...................................................... H01P 3/10
USPC ............................................................ 333/240
See application file for complete search history.

(56) References Cited

U.S. PATENT DOCUMENTS

| 2,685,068 | A | 7/1954 | Goubau |
| 2,852,275 | A | 9/1958 | Brook |
| 2,852,753 | A | 9/1958 | Walter et al. |
| 4,730,172 | A | 3/1988 | Bengeult |
| 4,743,916 | A | 5/1988 | Bengeult |
| 4,897,663 | A | 1/1990 | Kusano et al. |

(Continued)

FOREIGN PATENT DOCUMENTS

| CN | 104124211 A | 10/2014 |
| WO | 2018129156 A1 | 7/2018 |

OTHER PUBLICATIONS

Takura Tajima et al., 300-GHz Step-Profiled Corrugated Horn Antennas Integrated in LTCC, IEEE Transactions on Antennas and Propagation, vol. 62, No. 11, Nov. 2014, 8 pages.

(Continued)

*Primary Examiner* — Benny T Lee

(57) ABSTRACT

A surface wave excitation device includes a transmission line disposed on a wire layer PCB, and a same quantity of layers are respectively disposed above and below the wire layer PCB. A copper wire is disposed on each layer of PCB, and the copper wire forms a closed region. Closed regions on the PCB that are respectively disposed above and below the wire layer PCB and that have a same distance from the wire layer PCB are in a same shape, and a closed region on a PCB farther away from the wire layer PCB occupies a larger area. The wire layer PCB includes first and second closed regions, the first closed region is disposed on one side of the transmission line, and the second closed region is disposed on the other side, and shapes of the first and second closed regions are mutually symmetrical with the transmission line as a symmetry axis.

19 Claims, 3 Drawing Sheets

(56) References Cited

U.S. PATENT DOCUMENTS

| | | | |
|---|---|---|---|
| 7,009,471 | B2 | 3/2006 | Elmore |
| 7,567,154 | B2 | 7/2009 | Elmore |
| 8,497,749 | B2 | 7/2013 | Elmore |
| 8,897,697 | B1 | 11/2014 | Bennett et al. |
| 2011/0181375 | A1* | 7/2011 | Ma et al. ............... H01P 5/028 333/240 |
| 2016/0278094 | A1 | 9/2016 | Henry et al. |
| 2018/0191061 | A1* | 7/2018 | Sundaram et al. .. H05K 3/4697 |
| 2018/0241110 | A1 | 8/2018 | Sundaram et al. |

OTHER PUBLICATIONS

Glenn Elmore, Introduction to the Propagating Wave on a Single Conductor, Jul. 2009, total 30 pages.

Skanda Kotethota et al., Feasibility of Single Wire Communication for PCB-level Interconnects, 2017 IEEE 21 St Workshop on Signal and Power Integrity, May 2017,4 pages.

Yuan Liang et al., On-chip sub-terahertz surface plasmon polariton transmission lines in CMOS, Scientific Reports, Published: Oct. 8, 2015, total 13 pages.

Georg Goubau, Surface Waves and Their Application to Transmission Lines, Received Mar. 10, 1950, total 10 pages.

Extended European Search Report for Application No. 18934201.7 dated May 27, 2021, 11 pages.

PCT International Search Report for PCT/CN2018/105950 dated Sep. 17, 2018, 11 pages.

\* cited by examiner

SURFACE WAVE EXCITATION DEVICE HAVING A MULTI-LAYER PCB CONSTRUCTION WITH CLOSED REGIONS THEREIN

CROSS-REFERENCE TO RELATED APPLICATIONS

This application is a continuation of International Application No. PCT/CN2018/105950, filed on Sep. 17, 2018, the disclosure of which is hereby incorporated by reference in its entirety.

TECHNICAL FIELD

This application relates to communications technologies, and in particular, to a surface wave excitation device and a printed circuit board.

BACKGROUND

In the related art, communication is implemented by transmitting an electromagnetic wave through a power line. No additional optical fiber needs to be deployed, and only an existing high-altitude power line needs to be used. In this way, communication can be implemented even in remote rural areas as long as there is a power line. To use a power line for transmission and to have low-loss and ultra-bandwidth performance, a special electromagnetic wave needs to be used. The electromagnetic wave is a surface wave generated through conversion from a transverse electric magnetic (TEM) mode to a transverse magnetic (TM) mode. The surface wave is a wave in which an electromagnetic field is transmitted in circles outside a conductor cable. The transmission mode of the surface wave is the TM mode. The conductor cable only guides the electromagnetic field transmission, and no current is transmitted inside the conductor cable. Compared with conventional wireless transmission, the surface wave has good transmission directivity and is not easy to spread to cause radiation loss. Compared with a coaxial or metal cavity waveguide, the surface wave has little conductor loss when transmitted in free space. It can be seen that the surface wave has the characteristics of large bandwidth and low loss in the transmission process.

Generally, a surface wave excitation device uses a cone to implement conversion from the TEM mode to the TM mode. However, a cone that meets a communication index is relatively large, and cannot directly interconnect with a printed circuit board (PCB) to propagate the surface wave.

SUMMARY

This application provides a surface wave excitation device and a printed circuit board, to implement integration of the surface wave excitation device and the PCB and to facilitate surface wave propagation.

According to a first aspect, this application provides a surface wave excitation device, including: a multi-layer PCB structure and a transmission line, where the multi-layer PCB structure includes at least five layers of PCBs, the transmission line is disposed on a wire layer PCB of the at least five layers of PCBs, PCBs of a same quantity of layers are respectively disposed above and below the wire layer PCB, a copper wire is disposed on each layer of PCB, the copper wire is formed by spraying copper on the PCB, and the copper wire on each layer of PCB forms a closed region. Closed regions on PCBs that are respectively disposed above and below the wire layer PCB and that have a same distance from the wire layer PCB are in a same shape, and a closed region on a PCB farther away from the wire layer PCB occupies a larger area. There are two closed regions on the wire layer PCB, one region is disposed on one side of the transmission line, and the other is disposed on the other region side of the transmission line, and shapes of the two closed regions are mutually symmetrical with the transmission line as a symmetry axis. The copper wire disposed on each layer of PCB is used to convert a signal propagated in a TEM mode to a surface wave propagated in a TM mode, and the transmission line is used to guide the surface wave propagation.

The surface wave excitation device in this application is used to convert the signal propagated in the TEM mode to the surface wave propagated in the TM mode, and a characteristic of at least five layers of PCBs with sprayed copper is used to implement integration of the surface wave excitation device and the PCB, which is easy to integrate and easy for the surface wave excitation device to directly interconnect with the PCB to propagate the surface wave.

In a possible implementation, the signal is transmitted from a first end of the transmission line to a second end of the transmission line; and in a direction from the first end of the transmission line to the second end of the transmission line, a distance between the two closed regions on the wire layer PCB is increasing. In the direction from the first end of the transmission line to the second end of the transmission line, the two closed regions on the wire layer PCB are jointly enclosed on edges opposite to each other to form a semi-closed region, an opening of the semi-closed region faces the second end of the transmission line, and the semi-closed region gradually expands on two sides in the opening direction. Shapes of closed regions disposed on PCBs above and below the wire layer PCB are rectangles; a long side of the rectangle is parallel to the transmission line, and one end of the long side of the rectangle is flush with the first end of the transmission line. A centerline of a wide side of the rectangle is in the same plane with and parallel to the transmission line in a vertical direction. Lengths of long sides of the rectangles on the PCBs that are respectively disposed above and below the wire layer PCB and that have the same distance from the wire layer PCB are the same; and a long side of a rectangle on a PCB farther away from the wire layer PCB is longer.

The closed regions on the foregoing layers of PCBs jointly form the shape of a square box and a hollow structure inside, which achieves an effect of gradually increasing impedance in a direction in which a signal is transmitted on the transmission line, and the signal propagated in a TEM mode may be converted to a surface wave propagated in a TM mode. The surface wave propagation is guided by the transmission line. It can be seen that the surface wave excitation device in this application uses a feature of at least five layers of PCBs with sprayed copper, to easily implement integration of the surface wave excitation device and the PCB, and the surface wave excitation device is easy to directly interconnect with the PCB to propagate the surface wave.

In a possible implementation, a shape of a cross section of the semi-closed region on the wire layer PCB includes a trapezoid, a triangle, or an arc.

In a possible implementation, on the wire layer PCB, the signal is transmitted from the first end of the transmission line to the second end of the transmission line; and the transmission line tapers in the direction from the first end of the transmission line to the second end of the transmission line.

In a possible implementation, the transmission line is further connected with a cable, and the cable is configured to propagate a surface wave introduced through the transmission line.

The surface wave is propagated in circles outside the cable. The cable herein only guides the surface wave transmission, and no current is transmitted inside the cable, which meets the communication requirements of high bandwidth and low loss.

According to a second aspect, this application provides a PCB. A surface wave excitation device in the first aspect is disposed on the PCB, to easily implement integration of the surface wave excitation device and the PCB, and the surface wave excitation device is easy to directly interconnect with the PCB to propagate a surface wave

BRIEF DESCRIPTION OF DRAWINGS

To describe the technical solutions in this application more clearly, the following briefly describes the accompanying drawings for describing the embodiments or the prior art. It is clearly that the accompanying drawings in the following description show some embodiments of this application, and a person of ordinary skill in the art may still derive other drawings from these accompanying drawings without creative efforts.

DESCRIPTION OF EMBODIMENTS

To make the objectives, technical solutions, and advantages of this application clearer, the following clearly and completely describes the technical solutions in this application with reference to the accompanying drawings in this application. It is clear that the described embodiments are merely a part rather than all of the embodiments of this application. All other embodiments obtained by a person of ordinary skill in the art based on the embodiments of this application without creative efforts shall fall within the protection scope of this application.

Figure 1:
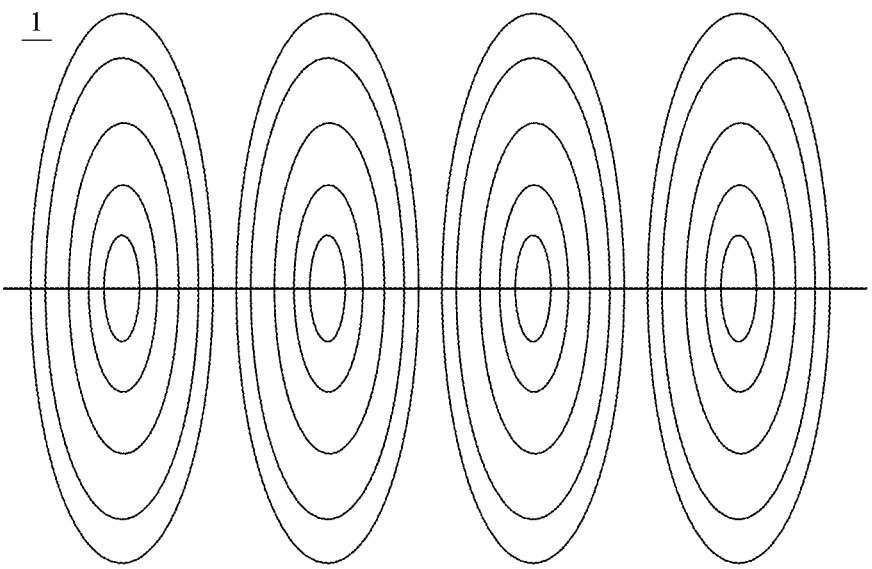
FIG. 1 is a schematic diagram of a propagation form of a surface wave.

In the related art, a surface wave is propagated through a power line. No additional optical fiber needs to be deployed and only an existing high-altitude power line needs to be used. In this way, communication can be implemented even in remote rural areas as long as there is a power line, thereby reducing costs incurred in deploying optical fiber backhaul, increasing wireless coverage regions, and providing convenient scenarios for Internet of Things (IoT) applications. FIG. 1 is a schematic diagram of a propagation form of a surface wave 1. As shown in FIG. 1, a surface wave 1 may be generated through conversion from a TEM mode to a TM mode. The surface wave 1 is a wave in which an electromagnetic field is transmitted in circles outside a conductor cable. The transmission mode of the surface wave 1 is the TM mode. The conductor cable herein only guides the electromagnetic field transmission, and no current is transmitted inside the conductor cable. Compared with conventional wireless transmission, the surface wave 1 has good transmission directivity and is not easy to spread to cause radiation loss. Compared with a coaxial or metal cavity waveguide, the surface wave 1 has little conductor loss when transmitted in free space. It can be seen that the surface wave 1 has the characteristics of large bandwidth and low loss in the transmission process. In the prior art, a surface wave excitation device uses a cone to implement conversion from the TEM mode to the TM mode. However, a cone that meets a communication index is relatively large, and cannot directly interconnect with a PCB to propagate the surface wave.

To resolve the foregoing problem, this application provides a surface wave excitation device, including: a multi-layer PCB structure and a transmission line, where the multi-layer PCB structure includes at least five layers of PCBs, the transmission line is disposed on a wire layer PCB of the at least five layers of PCBs, PCBs of a same quantity of layers are respectively disposed above and below the wire layer PCB, a copper wire is disposed on each layer of PCB, the copper wire is formed by spraying copper on the PCB board, and the copper wire on each layer of PCB forms a closed region. Closed regions on PCBs that are respectively disposed above and below the wire layer PCB and that have a same distance from the wire layer PCB are in a same shape, and a closed region on a PCB farther away from the wire layer PCB occupies a larger area. There are two closed regions on the wire layer PCB, one region of which is disposed on one side of the transmission line, and the other is disposed on the other region side of the transmission line, and shapes of the two closed regions are mutually symmetrical with the transmission line as a symmetry axis. The copper wire disposed on each layer of PCB is used to convert a signal propagated in a TEM mode to a surface wave propagated in a TM mode, and the transmission line is used to guide the surface wave propagation. It may be considered that the closed regions formed by the copper wires disposed on the PCB layers jointly form the shape of a square box and a hollow structure inside (It should be noted that the hollow described herein is not true hollow, but is that the closed regions of the layers form a hollow structure. Actually, there is a PCB medium in the hollow part). The hollow part takes on a shape of a gradually increasing opening in a direction in which a signal is transmitted on the transmission line, and a copper medium is used between a side wall of the hollow part and an outer surface of the square box. The feature of the electromagnetic field distribution of the surface wave is mainly concentrated in a region inside a medium forming a waveguide and near to a surface of the medium, and the electromagnetic field decays exponentially with the increase of the distance from the surface outside the medium. The closed regions on the foregoing layers of PCBs jointly form the shape of a square box and a hollow structure inside of the closed region, which achieves an effect of gradually increasing impedance in a direction in which a signal is transmitted on the transmission line, and the signal propagated in a TEM mode may be converted to a surface wave propagated in a TM mode. The surface wave propagation is guided by the transmission line. It can be seen that the surface wave excitation device in this application uses a feature of at least five layers of PCBs with sprayed copper, to easily implement integration of the surface wave excitation device and the PCB, and the surface wave excitation device is easy to directly interconnect with the PCB to propagate the surface wave.

The following describes the technical solutions of this application in detail by using several specific non-limiting example embodiments.

Figure 2A:
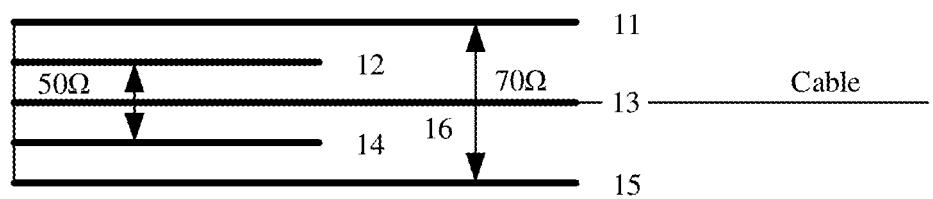
FIG. 2a is a schematic side view structural diagram of embodiment 1 of a surface wave excitation device according to this application.
Figure 2B:
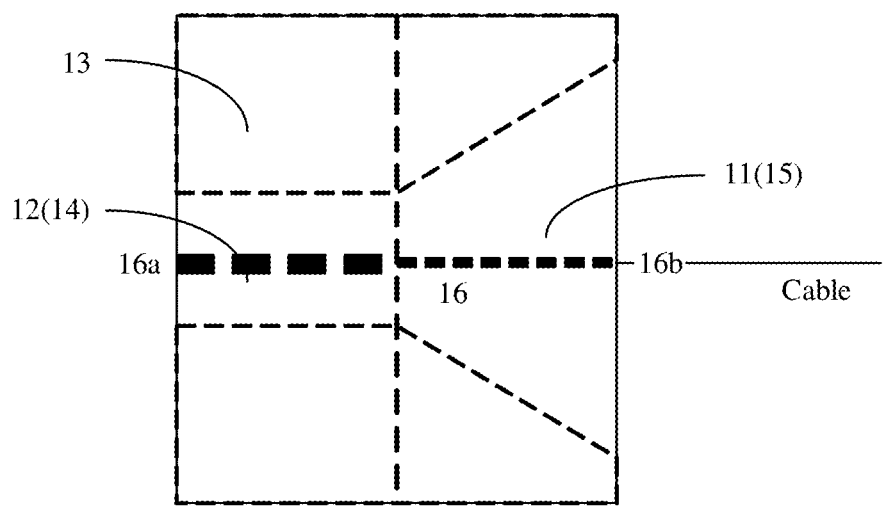
FIG. 2b is a schematic top perspective structural diagram of embodiment 1 of a surface wave excitation device according to this application.
Figure 2C:
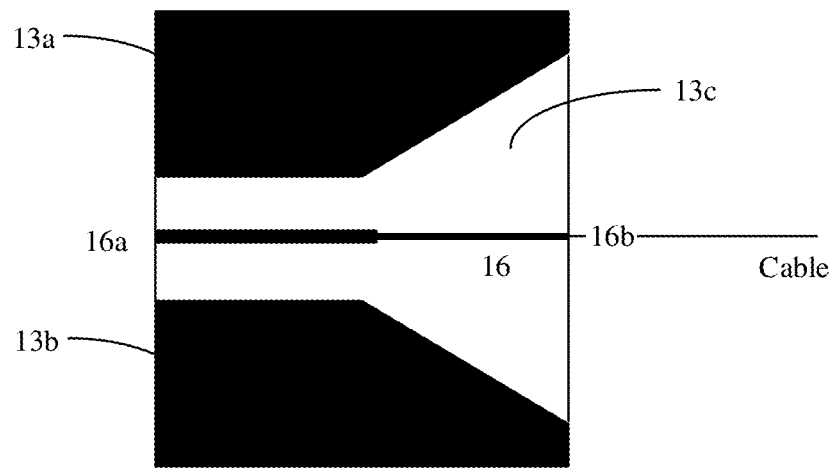
FIG. 2c is a schematic structural diagram of a wire layer PCB of embodiment 1 of a surface wave excitation device according to this application.

FIG. 2a is a schematic side view structural diagram of embodiment 1 of a surface wave excitation device according to this application. FIG. 2b is a schematic top perspective structural diagram of embodiment 1 of a surface wave excitation device according to this application. FIG. 2c is a schematic structural diagram of a wire layer PCB of embodiment 1 of a surface wave excitation device according to this application. In combination with FIG. 2a, FIG. 2b, and FIG. 2c (a copper wire structure on a PCB board is shown in the accompanying drawings, and the PCB board is not shown), the device in this embodiment may include: five layers of PCBs (PCB 11, PCB 12, PCB 13, PCB 14, and PCB 15 sequentially shown from top to bottom), and a transmission line 16. The transmission line 16 is disposed on PCB 13 located in the middle, a copper wire is disposed on each of PCB 11, PCB 12, PCB 13, PCB 14, and PCB 15, and the copper wire forms a closed region on each layer of PCB.

On PCB 13, two closed regions (e.g., closed regions 13a and 13b) are formed by the copper wire. The closed regions 13a and 13b are respectively disposed on two sides of the transmission line 16, and the closed regions 13a and 13b are mutually symmetrical with the transmission line 16 as a symmetry axis. A signal is transmitted from a first end 16a of the transmission line 16 to a second end 16b, and a distance between the closed regions 13a and 13b is increasing in the signal transmission direction. The closed regions 13a and 13b on PCB 13 are jointly enclosed on edges opposite to each other to form a semi-closed region 13c, an opening of the semi-closed region 13c faces the second end 16b of the transmission line, and the semi-closed region 13c gradually expands on two sides in the opening direction. In FIG. 2c, a shape of a cross section of the semi-closed region 13c on PCB 13 is a triangle. Optionally, a shape of a cross section of the semi-closed region 13c on PCB 13 may alternatively be a trapezoid or an arc, as long as the cross section is in the signal transmission direction and two sides of the semi-closed region 13c gradually expands. This is not specifically limited in this embodiment of this application.

On PCB 11, PCB 12, PCB 14, and PCB 15, shapes of the closed regions formed by the copper wires are all rectangles, a long side of the rectangle is parallel to the transmission line 16, and one end of the long side of the rectangle is flush with the first end 16a of the transmission line 16. A centerline of a wide side of the rectangle is in the same plane with and parallel to the transmission line 16 in a vertical direction. Long sides of the rectangles on PCB 11 and PCB 15 have the same length, long sides of the rectangles on PCB 12 and PCB 14 have the same length, and the lengths of the long sides of the rectangles on PCB 12 and PCB 14 are less than the lengths of the long sides of the rectangles on PCB 11 and PCB 15.

In the transmission direction from the first end 16a of the transmission line 16 to the second end 16b, the transmission line 16 tapers. Such a shape can fit with the closed region formed by the copper wire on the PCB, to better improve the accuracy of generated impedance.

The transmission mode of the surface wave is a TM mode, and the mode is obtained through conversion after impedance is gradually increased in the TEM mode. In this embodiment of this application, a multi-layer PCB structure is used, and the transmission line 16 is disposed on PCB 13 in the middle. To ensure symmetry of field distribution in a propagation process of the surface wave, the transmission line 16 is used as a central axis, copper is sprayed on PCB 13 to form two symmetrical closed regions, and copper is sprayed on the upper and lower PCBs (PCB 11, PCB 12, PCB 14, and PCB 15) of PCB 13 to form a rectangular closed region. A long side of the rectangle increases layer by layer in the transmission direction from the first end 16a of the transmission line 16 to the second end 16b and in the direction away from PCB 13. As the length of the long side of the rectangle increases layer by layer, the impedance generated by combining the rectangle on each PCB with the two closed regions on PCB 13 is increasing. The distance between the two closed regions on PCB 13 gradually increases, and the distance matches with layer order transformation of the impedance generated by the rectangles on PCB 11, PCB 12, PCB 14, and PCB 15 to achieve an effect of increasing output impedance. In FIG. 2a, the rectangles on PCB 12 and PCB 14 and parts closer to each other in the two closed regions on PCB 13 are combined to generate an impedance of 50Ω, and the rectangles on PCB 11 and PCB 15 and parts farther from each other in the two closed regions on PCB 13 are combined to generate an impedance of 70Ω. It can be seen that the impedance of the surface wave excitation device used in this embodiment of this application increases layer by layer, reflection decreases layer by layer, and performance correspondingly improves.

Figure 3A:
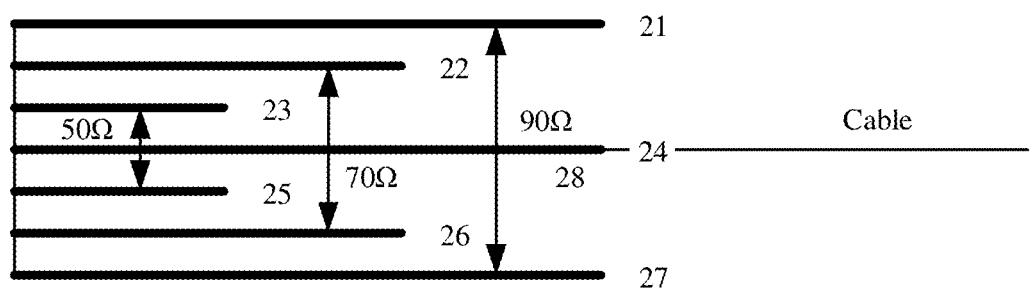
FIG. 3a is a schematic side view structural diagram of embodiment 2 of a surface wave excitation device according to this application.
Figure 3B:
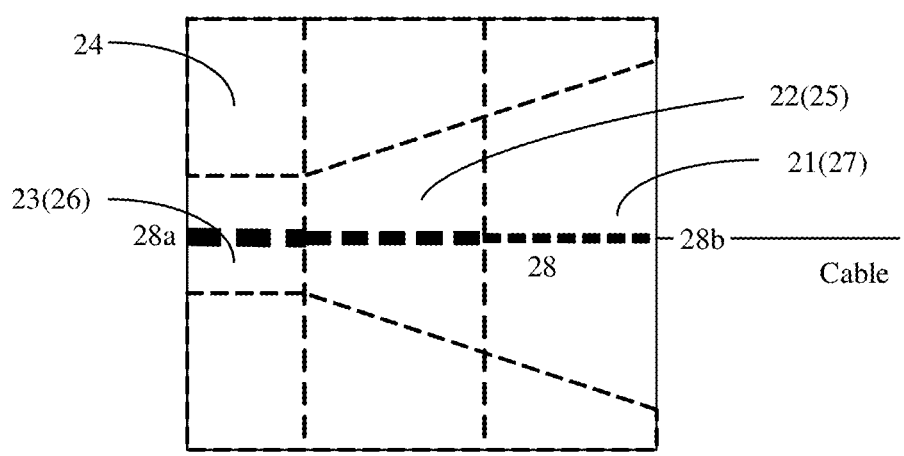
FIG. 3b is a schematic top perspective structural diagram of embodiment 2 of a surface wave excitation device according to this application.
Figure 3C:
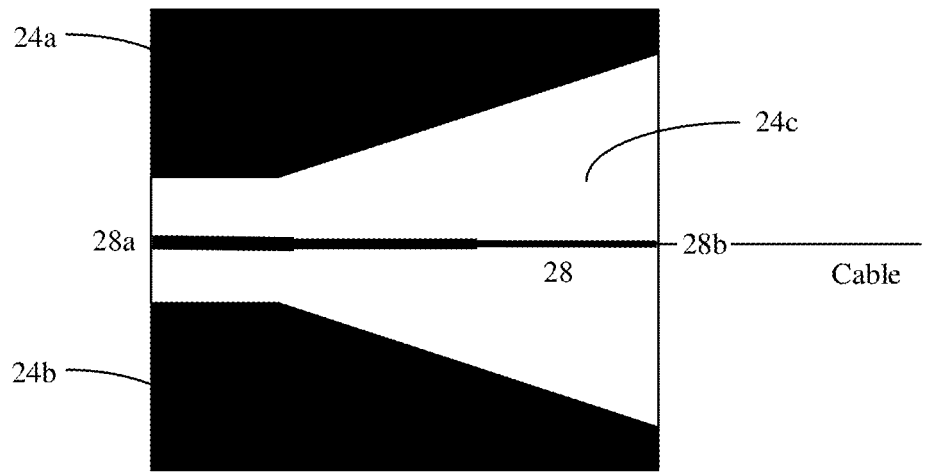
FIG. 3c is a schematic structural diagram of a wire layer PCB of embodiment 2 of a surface wave excitation device according to this application.

FIG. 3a is a schematic side view structural diagram of embodiment 2 of a surface wave excitation device according to this application. FIG. 3b is a schematic top perspective structural diagram of embodiment 2 of a surface wave excitation device according to this application. FIG. 3c is a schematic structural diagram of a wire layer PCB of embodiment 2 of a surface wave excitation device according to this application. In combination with FIG. 3a, FIG. 3b, and FIG. 3c (a copper wire structure on a PCB board is shown in the accompanying drawings, and the PCB board is not shown), the device in this embodiment may include seven layers of PCBs (PCB 21, PCB 22, PCB 23, PCB 24, PCB 25, PCB 26, and PCB 27 sequentially from top to bottom) and a transmission line 28. The transmission line 28 is disposed on PCB 24 located in the middle, and a copper wire structure is disposed on each of PCB 21, PCB 22, PCB 23, PCB 24, the PCB 25, PCB 26, and PCB 27, and the copper wire forms a closed region on each layer of PCB.

On PCB 24, two closed regions (closed regions 24a and 24b) are formed by the copper wire. The closed regions 24a and 24b are respectively disposed on two sides of the transmission line 28, and the closed regions 24a and 24b are mutually symmetrical with the transmission line 28 as a symmetry axis. A signal is transmitted from a first end 28a of the transmission line 28 to a second end 28b, and a distance between the closed regions 24a and 24b increases in the signal transmission direction. The closed regions 24a and 24b on PCB 24 are jointly enclosed on edges opposite to each other to form a semi-closed region 24c, an opening of the semi-closed region 24c faces the second end 28b of the transmission line, and the semi-closed region 24c gradually expands on two sides in the opening direction. In FIG. 3c, a shape of a cross section of the semi-closed region 24c on PCB 24 is a triangle. Optionally, a shape of a cross section of the semi-closed region 24c on PCB 24 may alternatively be a trapezoid or an arc, as long as the cross section is in the signal transmission direction and two sides of the semi-closed region 24c gradually expands. This is not specifically limited in this embodiment of this application.

On PCB 21, PCB 22, PCB 23, PCB 25, PCB 26, and PCB 27, shapes of the closed region formed by the copper wires are rectangles, a long side of the rectangle is parallel to the transmission line 28, and one end of the long side of the rectangle is flush with the first end 28a of the transmission line 28. A centerline of a wide side of the rectangle is in the same plane with and parallel to the transmission line 28 in a vertical direction. Long sides of the rectangles on PCB 21 and PCB 27 have the same length, long sides of the rectangles on PCB 22 and PCB 26 have the same length, and long sides of the rectangles on PCB 23 and PCB 25 have the same length. The lengths of the long sides of the rectangles on PCB 23 and PCB 25 are less than the lengths of the long sides of the rectangles on PCB 22 and PCB 26, and the lengths of the long sides of the rectangles on PCB 22 and PCB 26 are less than the lengths of the long sides of the rectangles on PCB 21 and PCB 27.

A difference from embodiment 1 shown in FIG. 2a to FIG. 2c lies in that the multilayer PCB structure in this embodiment of this application includes seven layers of PCBs, and therefore impedance transformation of one more order can be implemented. As shown in FIG. 3a, the rectangles on PCB 23 and PCB 25 and parts closest to each other in the two closed regions on PCB 24 are combined to generate an impedance of 50Ω, and the rectangles on the PCB 22 and the PCB 26 and parts closer to each other in the two closed regions on PCB 24 are combined to generate an impedance of 70Ω, and the rectangles on PCB 21 and PCB 27 and parts farthest away from each other in the two closed regions on PCB 24 are combined to generate an impedance of 90Ω. It can be seen that the impedance of the surface wave excitation device used in this embodiment of this application increases layer by layer, reflection decreases layer by layer, and performance correspondingly improves. Compared with the two-layer impedance increase in embodiment 1, this embodiment of this application implements three-layer impedance increase, and has better surface wave propagation performance, and less energy loss of the surface wave.

It should be noted that, the spatially symmetric increase copper wire structure used by the surface wave excitation device in this application includes at least five layers of PCBs. On a basis that a process level allows and costs are controllable, a larger quantity of PCB layers indicates a larger impedance transformation order that can be implemented, and better surface wave transmission performance can be achieved. Therefore, the quantity of PCB layers is not specifically limited.

Figure 4:
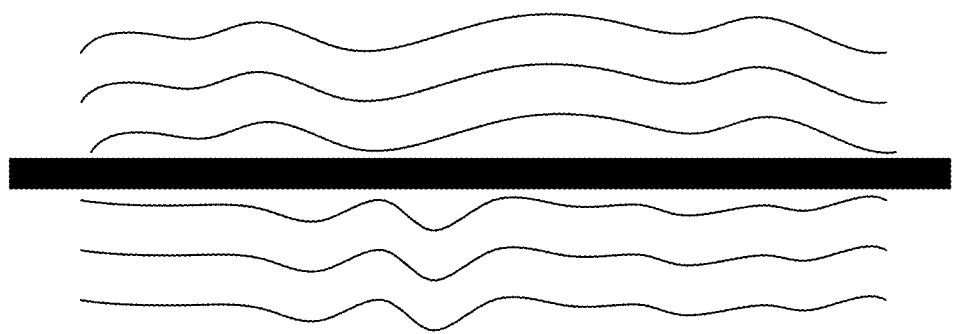
FIG. 4 is a simulation diagram of electric field distribution of surface wave propagation from a surface wave excitation device to a copper wire.

In the foregoing embodiment, both the transmission line 16 and the transmission line 28 are connected with a cable to propagate a surface wave introduced through the transmission line. The surface wave 1 is propagated on the cable in the form shown in FIG. 1. The cable herein only guides the surface wave transmission, and no current is transmitted inside the cable, which meets the communication requirements of large bandwidth and low loss. FIG. 4 is a simulation diagram of electric field distribution of surface wave propagation from a surface wave excitation device to a copper wire. As shown in FIG. 4, according to the technical solutions of this application, the surface wave 100 is well transitioned from the surface wave excitation device to the cable for propagation.

The surface wave excitation device shown in FIG. 2a to FIG. 3c uses a feature of at least five layers of PCBs with sprayed copper, to implement integration of the surface wave excitation device and the PCB. The integration is easy and the surface wave excitation device is easy to directly interconnect with the PCB to propagate the surface wave. Based on this, an embodiment of this application provides a PCB. The PCB may be used in a signal transmission device. The foregoing surface wave excitation device is disposed on the PCB to implement surface wave transmission, which provides a technical effect same as that in the foregoing embodiment.

Finally, it should be noted that the foregoing embodiments are merely intended for describing the technical solutions of this application other than limiting this application. Although this application is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of this application.

What is claimed is:

1. A surface wave excitation device, comprising:
a multi-layer printed circuit board (PCB) structure; and
a transmission line, wherein
the multi-layer PCB structure comprises at least five layers of PCBs;
the transmission line is disposed on a wire layer PCB of the at least five layers of PCBs, and PCBs of a same quantity of layers are respectively disposed above and below the wire layer PCB;
a copper wire is disposed on each layer of PCB of the at least five layers of PCB, and the copper wire on each layer of PCB forms a closed region;
closed regions on PCBs that are respectively disposed above and below the wire layer PCB and that have a same distance from the wire layer PCB are in a same shape, and a closed region on a PCB farther away from the wire layer PCB occupies a larger area;
the wire layer PCB includes first and second closed regions, the first closed region is disposed on one side of the transmission line, and the second closed region is disposed on the other side of the transmission line, and shapes of the first and second closed regions are mutually symmetrical with the transmission line as a symmetry axis; and
the copper wire disposed on each layer of PCB is used to convert a signal propagated in a transverse electric magnetic (TEM) mode to a surface wave propagated in a transverse magnetic (TM) mode, and the transmission line is used to guide the surface wave propagation.

2. The surface wave excitation device according to claim 1, wherein on the wire layer PCB, the signal is transmitted from a first end of the transmission line to a second end of the transmission line; and
in a direction from the first end of the transmission line to the second end of the transmission line, a distance between the first and second closed regions on the wire layer PCB increases.

3. The surface wave excitation device according to claim 2, wherein in the direction from the first end of the transmission line to the second end of the transmission line, the first and second closed regions on the wire layer PCB are jointly enclosed on edges opposite to each other to form a semi-closed region, an opening of the semi-closed region faces the second end of the transmission line, and the semi-closed region gradually expands on two sides in the opening direction.

4. The surface wave excitation device according to claim 3, wherein a shape of a cross section of the semi-closed region on the wire layer PCB comprises a trapezoid, a triangle, or an arc.

5. The surface wave excitation device according to claim 1, wherein on the wire layer PCB, the signal is transmitted from the first end of the transmission line to the second end of the transmission line; and
shapes of the closed regions disposed on the PCB above and below the wire layer PCB are rectangles, a long side of the rectangle is parallel to the transmission line, one end of the long side of the rectangle is flush with the first end of the transmission line, and a centerline of a wide side of the rectangle is in the same plane with and parallel to the transmission line in a vertical direction.

6. The surface wave excitation device according to claim 5, wherein lengths of long sides of the rectangles on the PCBs, that are respectively disposed above and below the wire layer PCB and that have the same distance from the wire layer PCB, are the same, and a long side of a rectangle on a PCB farther away from the wire layer PCB is longer.

7. The surface wave excitation device according to claim 1, wherein on the wire layer PCB, the signal is transmitted from the first end of the transmission line to the second end of the transmission line; and
the transmission line tapers in the direction from the first end of the transmission line to the second end of the transmission line.

8. The surface wave excitation device according to claim 1, wherein the transmission line is further connected with a cable, and the cable is used to propagate a surface wave introduced through the transmission line.

9. The surface wave excitation device according to claim 8, wherein the cable is used to guide the surface wave propagation without transmitting current inside the cable.

10. The surface wave excitation device according to claim 1, wherein
the at least five layers of PCBs include a first PCB, a second PCB, a third PCB, a fourth PCB, and a fifth PCB, and
a long side of a rectangle of the first PCB and the fifth PCB have a same length, and
a long side of a rectangle of the second PCB and the fourth PCB have a same length.

11. The surface wave excitation device according to claim 1, wherein
the multi-layer PCB structure comprises at least seven layers of PCBs,
the at least seven layers of PCBs include a first PCB, a second PCB, a third PCB, a fourth PCB, a fifth PCB, a sixth PCB, and a seventh PCB,
a long side of a rectangle of the first PCB and the seventh PCB have a same length,
a long side of a rectangle of the second PCB and the sixth PCB have a same length, and
a long side of a rectangle of the third PCB and the fifth PCB have a same length.

12. A printed circuit board (PCB), comprising:
a multi-layer PCB structure; and
a transmission line, wherein
the multi-layer PCB structure comprises at least five layers of PCBs;
the transmission line is disposed on a wire layer PCB of the at least five layers of PCBs, and PCBs of a same quantity of layers are respectively disposed above and below the wire layer PCB;
a copper wire is disposed on each layer of PCB of the at least five layers of PCB, and the copper wire on each layer of PCB forms a closed region;
closed regions on PCBs that are respectively disposed above and below the wire layer PCB and that have a same distance from the wire layer PCB are in a same shape, and a closed region on a PCB farther away from the wire layer PCB occupies a larger area;
the wire layer PCB includes first and second closed regions, the first closed region is disposed on one side of the transmission line, and the second closed region is disposed on the other side of the transmission line, and shapes of the first and second closed regions are mutually symmetrical with the transmission line as a symmetry axis; and
the copper wire disposed on each layer of PCB is used to convert a signal propagated in a transverse electric magnetic (TEM) mode to a surface wave propagated in a transverse magnetic (TM) mode, and the transmission line is used to guide the surface wave propagation.

13. The PCB according to claim 12, wherein on the wire layer PCB, the signal is transmitted from the first end of the transmission line to the second end of the transmission line; and
shapes of the closed regions disposed on the PCB above and below the wire layer PCB are rectangles, a long side of the rectangle is parallel to the transmission line, one end of the long side of the rectangle is flush with the first end of the transmission line, and a centerline of a wide side of the rectangle is in the same plane with and parallel to the transmission line in a vertical direction.

14. The PCB according to claim 13, wherein lengths of long sides of the rectangles on the PCBs, that are respectively disposed above and below the wire layer PCB and that have the same distance from the wire layer PCB, are the same, and a long side of a rectangle on a PCB farther away from the wire layer PCB is longer.

15. The PCB according to claim 12, wherein on the wire layer PCB, the signal is transmitted from the first end of the transmission line to the second end of the transmission line; and
the transmission line tapers in the direction from the first end of the transmission line to the second end of the transmission line.

16. The PCB according to claim 12, wherein the transmission line is further connected with a cable, and the cable is used to propagate a surface wave introduced through the transmission line.

17. The PCB according to claim 12, wherein on the wire layer PCB, the signal is transmitted from a first end of the transmission line to a second end of the transmission line; and
in a direction from the first end of the transmission line to the second end of the transmission line, a distance between the first and second closed regions on the wire layer PCB increases.

18. The PCB according to claim 17, wherein in the direction from the first end of the transmission line to the second end of the transmission line, the first and second closed regions on the wire layer PCB are jointly enclosed on edges opposite to each other to form a semi-closed region, an opening of the semi-closed region faces the second end of the transmission line, and the semi-closed region gradually expands on two sides in the opening direction.

19. The PCB according to claim 18, wherein a shape of a cross section of the semi-closed region on the wire layer PCB comprises a trapezoid, a triangle, or an arc.

* * * * *